(12) United States Patent
Xie et al.

(10) Patent No.: US 12,543,544 B2
(45) Date of Patent: Feb. 3, 2026

(54) BACKSIDE DIRECT CONTACT FORMATION

(71) Applicant: International Business Machines Corporation, Armonk, NY (US)

(72) Inventors: Ruilong Xie, Niskayuna, NY (US); Kisik Choi, Watervliet, NY (US); Nicolas Jean Loubet, Guilderland, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 535 days.

(21) Appl. No.: 18/065,060

(22) Filed: Dec. 13, 2022

(65) Prior Publication Data
US 2024/0194528 A1 Jun. 13, 2024

(51) Int. Cl.
| | | |
|---|---|---|
| *H10D 30/67* | (2025.01) | |
| *H01L 21/28* | (2006.01) | |
| *H01L 21/768* | (2006.01) | |
| *H01L 23/528* | (2006.01) | |
| *H01L 23/535* | (2006.01) | |
| *H10D 30/01* | (2025.01) | |
| *H10D 62/10* | (2025.01) | |
| *H10D 64/01* | (2025.01) | |
| *H10D 84/01* | (2025.01) | |
| *H10D 84/03* | (2025.01) | |
| *H10D 84/83* | (2025.01) | |
| *H10D 88/00* | (2025.01) | |

(52) U.S. Cl.
CPC .. *H01L 21/76897* (2013.01); *H01L 21/28141* (2013.01); *H01L 23/5286* (2013.01); *H01L 23/535* (2013.01); *H10D 30/024* (2025.01); *H10D 30/6728* (2025.01); *H10D 62/121* (2025.01); *H10D 64/018* (2025.01); *H10D 84/0149* (2025.01); *H10D 84/017* (2025.01); *H10D 84/0193* (2025.01); *H10D 84/038* (2025.01); *H10D 84/834* (2025.01); *H10D 88/101* (2025.01)

(58) Field of Classification Search
CPC ............ H10D 30/6757; H10D 64/017; H10D 30/6735; H10D 62/151; H10D 64/251; H10D 64/254
See application file for complete search history.

(56) References Cited

U.S. PATENT DOCUMENTS 10,665,692 B2 5/2020 Xie et al.
11,183,558 B2 11/2021 Yeh et al.
(Continued)

*Primary Examiner* — Fernando L Toledo
*Assistant Examiner* — Adam S Bowen
(74) *Attorney, Agent, or Firm* — Cantor Colburn LLP; L. Jeffrey Kelly

(57) ABSTRACT

A semiconductor device is provided. The semiconductor device includes source/drain (S/D) epitaxy, a gate stack adjacent to the S/D epitaxy, a semiconductor layer underlying the gate stack and including a semiconductor material surrounded by an inner spacer, an etch stop layer underlying the semiconductor layer, back trench S/D epitaxy and a self-aligned backside contact. The backside trench S/D epitaxy contacts the S/D epitaxy and is insulated from the semiconductor material by the inner spacer. The self-aligned backside contact contacts the backside trench S/D epitaxy and is insulated from the semiconductor material by the etch stop layer.

20 Claims, 5 Drawing Sheets

(56) References Cited

U.S. PATENT DOCUMENTS

| | | |
|---|---|---|
| 11,189,705 B2 | 11/2021 | Wong et al. |
| 2021/0111115 A1 | 4/2021 | Morrow et al. |
| 2021/0134721 A1 | 5/2021 | Chiang et al. |
| 2021/0202385 A1 | 7/2021 | Huang et al. |
| 2021/0305252 A1 | 9/2021 | Chiang et al. |
| 2021/0305381 A1 | 9/2021 | Chiang et al. |
| 2021/0336019 A1 | 10/2021 | Su et al. |
| 2021/0351303 A1 | 11/2021 | Ju et al. |
| 2021/0376071 A1 | 12/2021 | Liu et al. |
| 2021/0376093 A1 | 12/2021 | Chu et al. |
| 2021/0399099 A1* | 12/2021 | Chu .................. H01L 21/76831 |
| 2021/0407999 A1 | 12/2021 | Huang et al. |
| 2021/0408246 A1 | 12/2021 | Ganguly et al. |

* cited by examiner

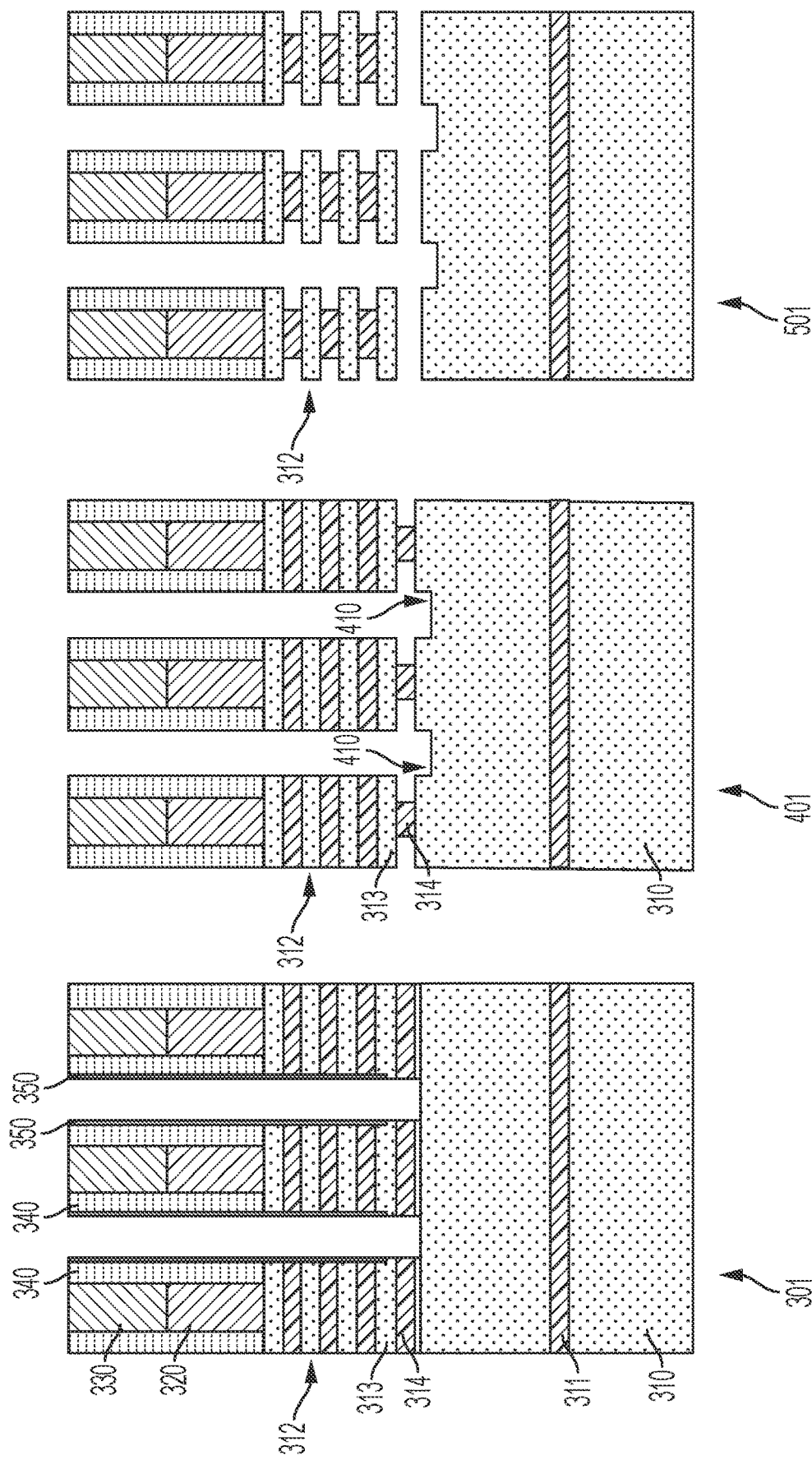

BACKSIDE DIRECT CONTACT FORMATION

BACKGROUND

The present invention generally relates to fabrication methods and resulting structures for semiconductor devices. More specifically, the present invention relates to a semiconductor device fabrication method with backside direct contact formation.

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

SUMMARY

Embodiments of the invention are directed to a semiconductor device. A non-limiting example of the semiconductor device includes source/drain (S/D) epitaxy, a gate stack adjacent to the S/D epitaxy, a semiconductor layer underlying the gate stack and including a semiconductor material surrounded by an inner spacer, an etch stop layer underlying the semiconductor layer, back trench S/D epitaxy and a self-aligned backside contact. The backside trench S/D epitaxy contacts the S/D epitaxy and is insulated from the semiconductor material by the inner spacer. The self-aligned backside contact contacts the backside trench S/D epitaxy and is insulated from the semiconductor material by the etch stop layer.

Embodiments of the present invention are directed to a semiconductor device. A non-limiting example of the semiconductor device includes first and second pillars of source/drain (S/D) epitaxy, gate stacks adjacent to each of the first and second pillars of the S/D epitaxy, a semiconductor layer underlying each of the gate stacks and including a semiconductor material surrounded by an inner spacer, an etch stop layer underlying each semiconductor layer, first and second pillars of backside trench S/D epitaxy and a self-aligned backside contact. The first and second pillars of the backside trench S/D epitaxy respectively contact the first and second pillars of the S/D epitaxy and are insulated from the corresponding semiconductor material by the corresponding inner spacer. The self-aligned backside contact contacts the first pillar of the backside trench S/D epitaxy and is insulated from the corresponding semiconductor material by the corresponding etch stop layer.

Embodiments of the present invention are directed to a method of semiconductor device fabrication. A non-limiting example of the method includes forming additional and sacrificial semiconductor layers underlying a gate stack, replacing the sacrificial semiconductor layer with an etch stop layer, removing a semiconductor substrate underlying the etch stop layer, indenting semiconductor material of the additional semiconductor layer to form an indentation, disposing an inner spacer in the indentation, forming backside trench S/D epitaxy contacting S/D epitaxy to which the gate stack is adjacent and being insulated from the semiconductor material by the inner spacer and forming a self-aligned backside contact contacting the backside trench S/D epitaxy and being insulated from the semiconductor material by the etch stop layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3 is a cross-sectional view of an initial structure of a semiconductor device taken along line 2-2 of FIG. 2 in accordance with one or more embodiments of the present invention;

FIG. 4 is a cross-sectional view of an intermediate structure of a semiconductor device taken along line 2-2 of FIG. 2 following a first semiconductor indentation process applied to the initial structure of FIG. 3 in accordance with one or more embodiments of the present invention;

FIG. 5 is a cross-sectional view of a second intermediate structure of a semiconductor device taken along line 2-2 of FIG. 2 following a second semiconductor indentation process applied to the intermediate structure of FIG. 4 in accordance with one or more embodiments of the present invention;

Figure 2:
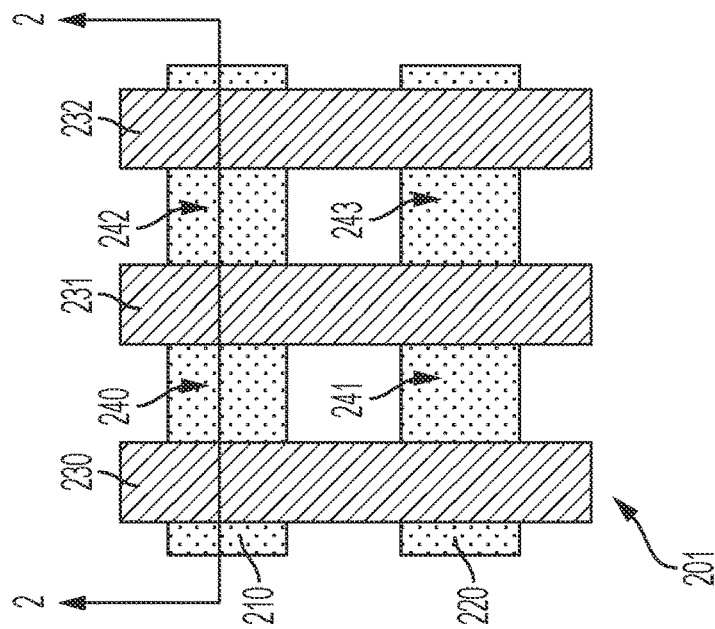
FIG. 2 depicts a top-down view of a semiconductor device according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a field effect transistor (FET) typically has a source, a channel and a drain where current flows from the source to the drain as well as a gate that controls the flow of current through the device channel. FETs can have a variety of different structures. For example, FETs have been fabricated with the source, channel and drain formed in a substrate material itself, where the current flows horizontally (i.e., in the plane of the substrate). As another example, FinFETs have been formed with the channel extending outwardly from the substrate, but where the current also flows horizontally from the source to the drain. The channel for the FinFET can be an upright slab of thin rectangular silicon (Si), commonly referred to as the fin with a gate on the fin, as compared to a metal-oxide-semiconductor FET (MOSFET) with a single gate parallel with the plane of the substrate. Depending on doping of the source and drain, an n-doped FET (nFET) or a p-doped FET (pFET) can be formed. Two FETs also can be coupled to form a complementary metal-oxide-semiconductor (CMOS) device, where a p-channel MOSFET and n-channel MOSFET are coupled together.

In certain logic circuits in which FETs are employed, it is often the case that a self-aligned backside contact is needed to mitigate poor overlay margin at a backside of a wafer. Formation or fabrication of such a self-aligned backside contact can be challenging, however, since doing so typically requires placeholder formation, backside silicon removal that is selective to a placeholder and other similar or related processes.

A need therefore remains for a self-aligned backside contact to mitigate poor overlay margin at a backside of a wafer.

Turning now to an overview of the aspects of the invention, one or more embodiments of the invention address the above-described shortcomings of the prior art by providing a method of semiconductor device fabrication. The method includes forming additional and sacrificial semiconductor layers underlying a gate stack, replacing the sacrificial semiconductor layer with an etch stop layer, removing a semiconductor substrate underlying the etch stop layer, indenting semiconductor material of the additional semiconductor layer to form an indentation, disposing an inner spacer in the indentation, forming backside trench S/D epitaxy contacting S/D epitaxy to which the gate stack is adjacent and being insulated from the semiconductor material by the inner spacer and forming a self-aligned backside contact contacting the backside trench S/D epitaxy and being insulated from the semiconductor material by the etch stop layer.

The above-described aspects of the invention address the shortcomings of the prior art by providing for a semiconductor device that includes a self-aligned backside contact to mitigate poor overlay margin at a backside of a wafer.

Figure 1:
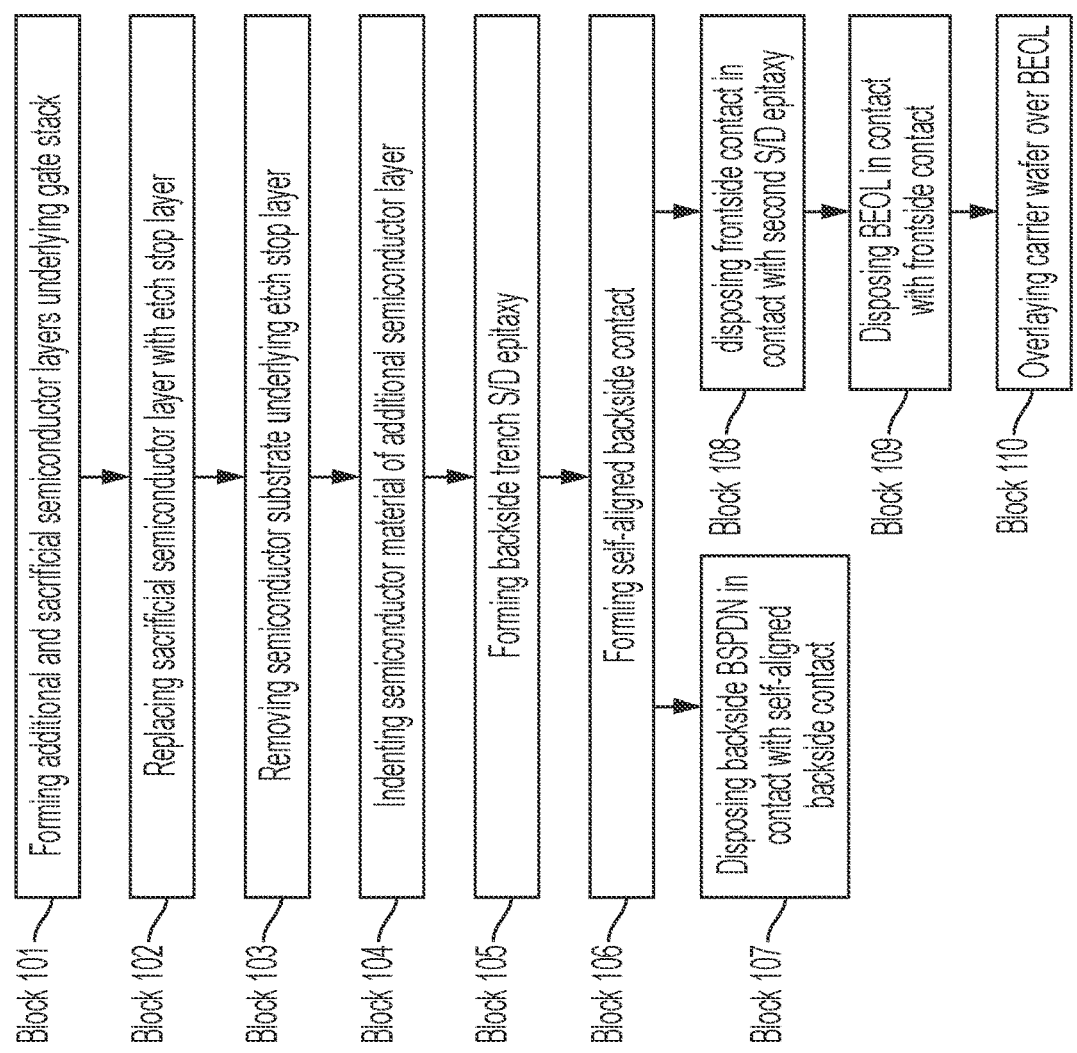
FIG. 1 is a flow diagram illustrating a method of semiconductor device fabrication in accordance with one or more embodiments of the present invention.

Turning now to a more detailed description of aspects of the present invention, FIG. 1 depicts a method of semiconductor device fabrication 100 according to one or more embodiments of the present invention.

As shown in FIG. 1, the method of semiconductor device fabrication 100 includes forming additional and sacrificial semiconductor layers underlying a gate stack (block 101). The gate stack can be disposed adjacent to a pillar of S/D epitaxy and can be provided as a nanosheet gate stack, for example. The method of semiconductor device fabrication 100 further includes replacing the sacrificial semiconductor layer with an etch stop layer (block 102), removing a semiconductor substrate underlying the etch stop layer (block 103), indenting semiconductor material (e.g., silicon) of the additional semiconductor layer to form an indentation and disposing an inner spacer in the indentation (block 104). The inner spacer can be made of a different material from the etch stop layer. The method of semiconductor device fabrication 100 can also include forming backside trench S/D epitaxy contacting the S/D epitaxy of the pillar (block 105), which can be doped and to which the gate stack is adjacent. The backside trench S/D epitaxy is insulated from the semiconductor material by the inner spacer. In addition, the method of semiconductor device fabrication 100 includes forming a self-aligned backside contact (block 106). The self-aligned backside contact is disposed to contact the backside trench S/D epitaxy and is insulated from the semiconductor material by the etch stop layer.

In accordance with one or more embodiments, the method of semiconductor device fabrication 100 can include one or more of disposing a backside power distribution network (BSPDN) in contact with the self-aligned backside contact (block 107) and disposing a frontside contact in contact with the second S/D epitaxy (block 108), disposing a back-end-of-line (BEOL) layer in contact with the frontside contact (block 109) and overlaying a carrier wafer over the BEOL layer (block 110).

In accordance with one or more embodiments, the S/D epitaxy can include first and second S/D epitaxy, the forming of the backside trench S/D epitaxy of block 105 can include forming the backside trench S/D epitaxy to include first and second backside trench S/D epitaxy respectively contacting the first and second S/D epitaxy and the forming of the self-aligned backside contact of block 106 can include forming the self-aligned backside contact to be disposed in contact with the first backside trench S/D epitaxy.

With reference to FIGS. 2-12, the method of semiconductor device fabrication 100 will now be described in greater detail.

FIG. 2 depicts a top-down view of the semiconductor device 201 being fabricated and illustrates that the semiconductor device 201 includes active regions 210, 220, gates 230, 231 and 232 and S/D regions 240, 241, 242, 243. FIGS. 3-12 are cross-sectional views of varying stages of semiconductor device fabrication which correspond to line 2-2 of FIG. 2.

As shown in FIG. 3, an initial structure 301 of a semiconductor device is provided in accordance with one or more embodiments of the present invention. The initial structure 301 includes remaining portions of a starting wafer. These remaining portions include a semiconductor substrate 310 (e.g., silicon), which is bisected by a semiconductor layer 311 (e.g., silicon germanium), a stack of nanosheet layers 312 (e.g., layers of silicon interleaved with layers of silicon germanium), an additional semiconductor layer 313 (e.g., silicon) and a sacrificial semiconductor layer 314 (e.g., silicon germanium). The additional semiconductor layer 313 underlies the lowest layer of the stack of nanosheet layers 312 and the sacrificial semiconductor layer 314 underlies the additional semiconductor layer 313. The starting wafer is subjected to nanosheet patterning and shallow trench isolation (STI) formation between the active regions 210 and 220 (see FIG. 2). Subsequently, the starting wafer is subject to dummy gate and spacer formation as well as nanosheet recessing to form dummy gates 320, gate hard masks 330 and spacers 340. The spacers 340 are disposed to line exterior surfaces of the dummy gates 320 and the gate hard masks 330. Next, protective liner spacer formation is executed to form a liner 350 that lines interior surfaces of the spacers 340 and the nanosheet layers 312. An additional silicon recess is then executed through the additional semiconductor layer 313 and the sacrificial semiconductor layer 314 to an upper surface of the semiconductor substrate 310.

As shown in FIG. 4, an intermediate structure 401 of a semiconductor device is provided in accordance with one or more embodiments of the present invention and results from a first semiconductor indentation process applied to the initial structure 301 of FIG. 3. The first semiconductor indentation process is executed with respect to the sacrificial semiconductor layer 314 and does not affect the exposed silicon of the semiconductor substrate 310 or the additional semiconductor layer 313. The first semiconductor indentation process also does not affect any of the layers of the stack of nanosheet layers 312 due to the presence of the liner 350 (see FIG. 3). The first semiconductor indentation process continues until the sacrificial semiconductor layer 314 is indented relative to the stack of nanosheet layers 312.

The intermediate structure 401 of FIG. 4 also results from removal of the liner 350 and a subsequent etching process (e.g., minor directional reactive ion etching (RIE) for example) to form recesses 410 in the semiconductor substrate 310.

As shown in FIG. 5, a second intermediate structure 501 of a semiconductor device is provided in accordance with one or more embodiments of the present invention and results from a second semiconductor indentation process applied to the intermediate structure 401 of FIG. 4. The second semiconductor indentation process is executed with respect to the remainder of the sacrificial semiconductor layer 314 and those layers of the stack of nanosheet layers 312 that are not formed of silicon, i.e., the silicon germanium layers. The second semiconductor indentation process continues until the remainder of the sacrificial semiconductor layer 314 is exhausted and thus results in the non-silicon layers of the stack of nanosheet layers 312 becoming indented relative to the silicon layers of the stack of nanosheet layers 312.

Figure 6:
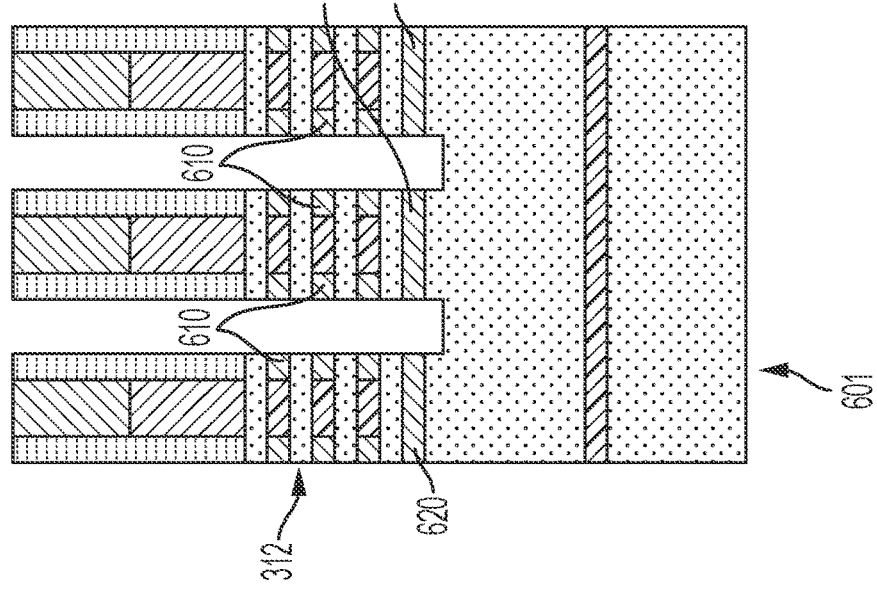
FIG. 6 is a cross-sectional view of a third intermediate structure of a semiconductor device taken along line 2-2 of FIG. 2 following inner spacer and etch stop layer formation applied to the second intermediate structure of FIG. 5 in accordance with one or more embodiments of the present invention.

As shown in FIG. 6, a third intermediate structure 601 of a semiconductor device is provided in accordance with one or more embodiments of the present invention and results from inner spacer and etch stop layer formation applied to the second intermediate structure 501 of FIG. 5. The inner spacer formation results in the formation of inner spacers 610 in the indentations of the non-silicon layers of the stack of nanosheet layers 312. The etch stop layer formation results in the formation of an etch stop layer 620 in the empty regions formally occupied by the sacrificial semiconductor layer 314.

Figure 7:
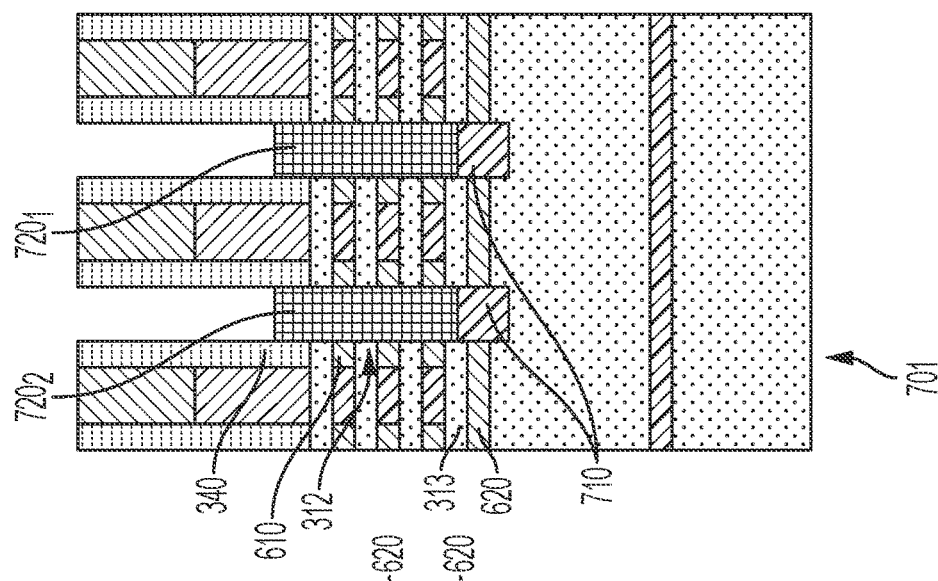
FIG. 7 is a cross-sectional view of a fourth intermediate structure of a semiconductor device taken along line 2-2 of FIG. 2 following epitaxial pillar formation applied to the third intermediate structure of FIG. 6 in accordance with one or more embodiments of the present invention.

As shown in FIG. 7, a fourth intermediate structure 701 of a semiconductor device is provided in accordance with one or more embodiments of the present invention and results from epitaxial pillar formation applied to the third intermediate structure 601 of FIG. 6. The epitaxial pillar formation initially includes deposition of semiconductor material 710 (e.g., silicon germanium) in the recesses 410 (see FIG. 4), along the etch stop layer 620 and up to a height of about halfway up the additional semiconductor layer 313. This is followed by growth of S/D epitaxy from upper surfaces of the semiconductor material 710 and between the silicon layers of the stack of nanosheet layers 312, the inner spacers 610 and lower portions of the spacers 340.

The growth of the S/D epitaxy forms pillars of S/D epitaxy 720, each of which can be heavily n-doped or p-doped. In accordance with one or more embodiments of the present invention, first and second pillars of S/D epitaxy 720$_1$ and 720$_2$ are formed. The following description will relate to this case, although it is to be understood that other numbers of pillars of S/D epitaxy can be formed.

Figure 8:
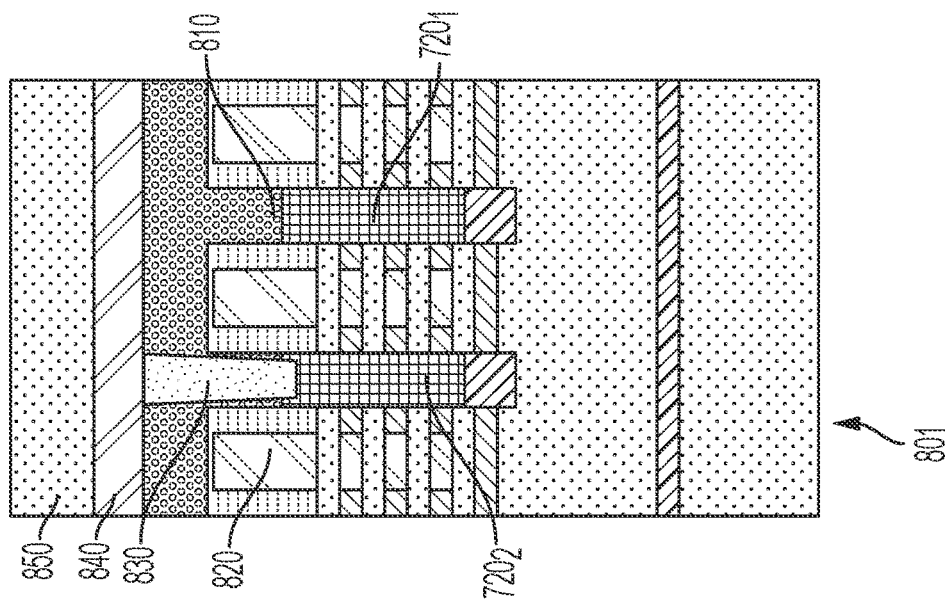
FIG. 8 is a cross-sectional view of a fifth intermediate structure of a semiconductor device taken along line 2-2 of FIG. 2 following contact formation, back-end-of-line (BEOL) formation and carrier wafer bonding applied to the fourth intermediate structure of FIG. 7 in accordance with one or more embodiments of the present invention.

As shown in FIG. 8, a fifth intermediate structure 801 of a semiconductor device is provided in accordance with one or more embodiments of the present invention. The fifth intermediate structure 801 results from deposition of interlayer dielectric (ILD) 810 on the first and second pillars of S/D epitaxy 720$_1$, 720$_2$, chemical mechanical polishing (CMP) or another similar process to remove the gate hard masks 330, removal of the dummy gates 320, removal of the non-silicon layers of the stack of nanosheet layers 312 for replacement by high-k metal gate material 820 and gate cut formation. The fifth intermediate structure 801 also results from formation of a contact 830 to be in contact with the second pillar of S/D epitaxy 720$_2$, formation of a back-end-of-line (BEOL) layer 840 and bonding of a carrier wafer 850 to the BEOL layer 840.

Figure 9:
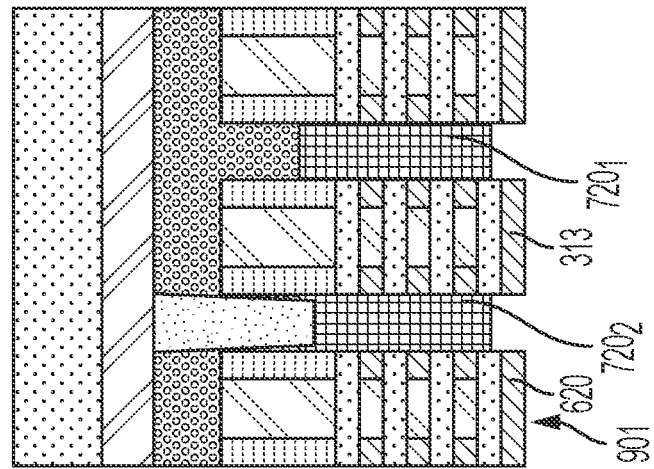
FIG. 9 is a cross-sectional view of a sixth intermediate structure of a semiconductor device taken along line 2-2 of FIG. 2 following semiconductor layer removal applied to the fifth intermediate structure of FIG. 8 in accordance with one or more embodiments of the present invention.

As shown in FIG. 9, a sixth intermediate structure 901 of a semiconductor device is provided in accordance with one or more embodiments of the present invention and results from a wafer flip and subsequent removal of the semiconductor substrate 310, the semiconductor layer 311 and the semiconductor material 710 (see FIGS. 3 and 7). This exposes respective lowermost surfaces of the first and second pillars of S/D epitaxy $720_1$ and $720_2$, lower portions of interior surfaces of the additional semiconductor layer 313 and interior surfaces of the etch stop layer 620.

Figure 10:
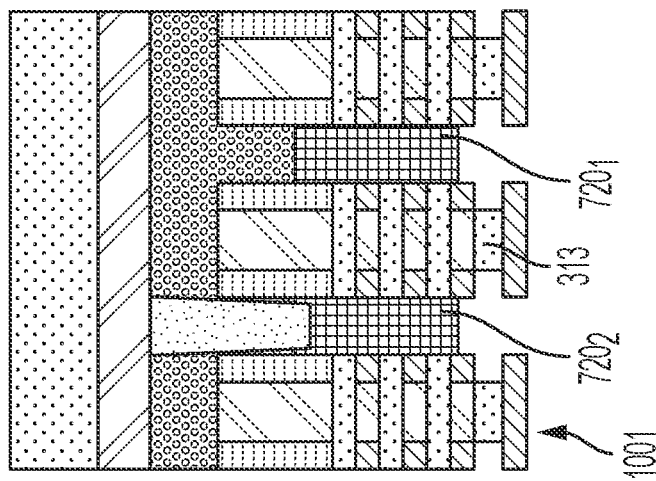
FIG. 10 is a cross-sectional view of a seventh intermediate structure of a semiconductor device taken along line 2-2 of FIG. 2 following a third semiconductor indentation process applied to the sixth intermediate structure of FIG. 9 in accordance with one or more embodiments of the present invention.

As shown in FIG. 10, a seventh intermediate structure 1001 of a semiconductor device is provided in accordance with one or more embodiments of the present invention and results from a third semiconductor indentation process applied to the sixth intermediate structure 901 of FIG. 9. The third semiconductor indentation process is executed with respect to the additional semiconductor layer 313 and continues until a remainder of the additional semiconductor layer 313 is recessed. The third semiconductor indentation process also results in the first and second pillars of S/D epitaxy $720_1$ and $720_2$ being recessed upwardly.

Figure 11:
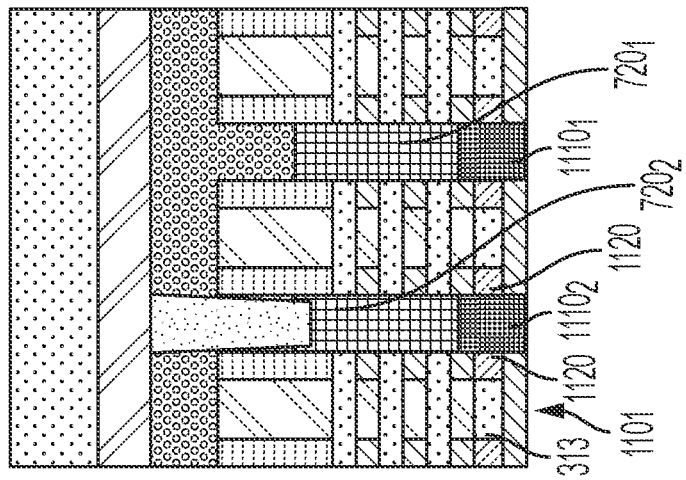
FIG. 11 is a cross-sectional view of an eighth intermediate structure of a semiconductor device taken along line 2-2 of FIG. 2 following inner spacer formation and formation of backside trench epitaxial pillars applied to the seventh intermediate structure of FIG. 10 in accordance with one or more embodiments of the present invention.

As shown in FIG. 11, an eighth intermediate structure 1101 of a semiconductor device is provided in accordance with one or more embodiments of the present invention and results from inner spacer formation and formation of first and second pillars of backside trench S/D epitaxy $1110_1$, $1110_2$ applied to the seventh intermediate structure 1001 of FIG. 10. The inner spacer formation forms inner spacers 1120 in indentions on either side of the remainder of the additional semiconductor material 313 which result from the third semiconductor indentation process. The inner spacers 1120 can be formed of different material from the etch stop layer 620. The first and second pillars of backside trench S/D epitaxy $1110_1$, $1110_2$ are respectively disposed in contact with the first and second pillars of S/D epitaxy $720_1$ and $720_2$.

Figure 12:
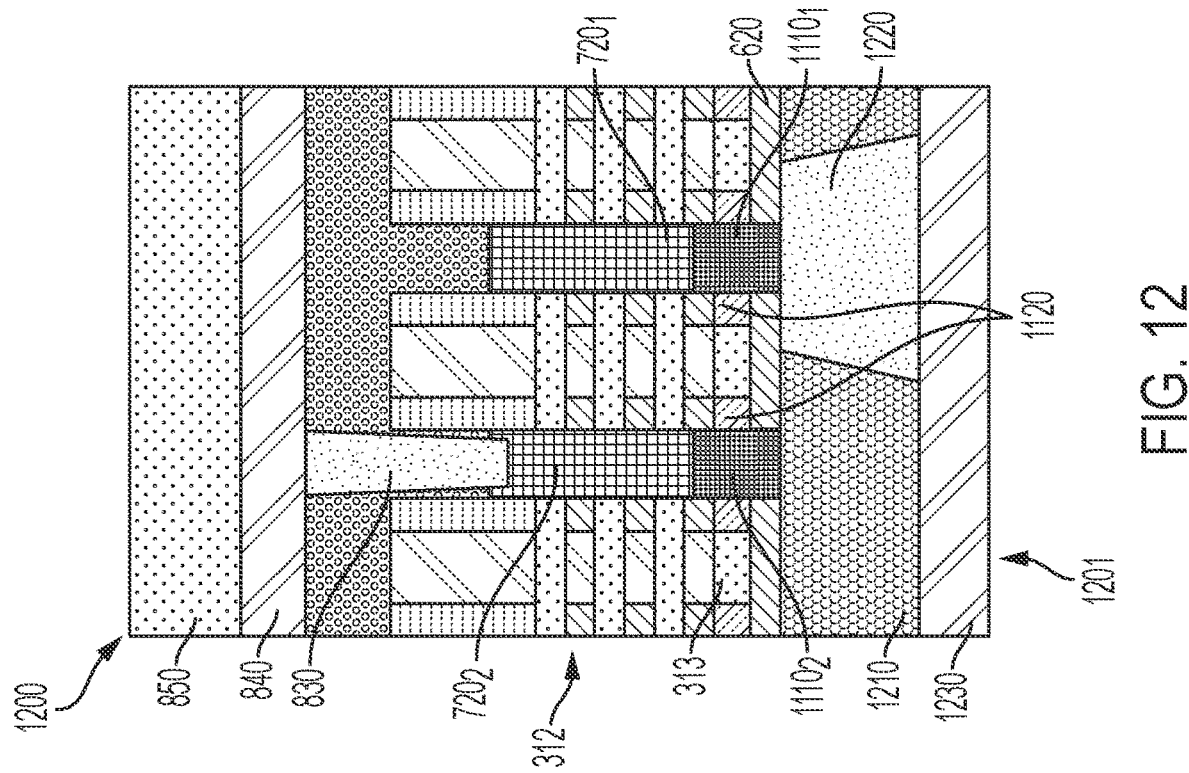
FIG. 12 is a cross-sectional view of a final structure of a semiconductor device taken along line 2-2 of FIG. 2 following backside contact formation and backside power delivery network formation applied to the eighth intermediate structure of FIG. 11 in accordance with one or more embodiments of the present invention.

As shown in FIG. 12, a final structure 1201 of a semiconductor device 1200 is provided in accordance with one or more embodiments of the present invention. The final structure 1201 results from backside ILD deposition and CMP to form a backside ILD layer 1210, backside contact formation to form a self-aligned backside contact 1220 in contact with the first pillar of backside trench S/D epitaxy $1110_1$ and formation of a BSPDN 1230 applied to the eighth intermediate structure 1101 of FIG. 11.

The semiconductor device 1200 thus includes first and second pillars of S/D epitaxy $720_1$ and $720_2$, which can be heavily doped, stacks of nanosheet layers 312 forming gate stacks adjacent to the first and second pillars of S/D epitaxy $720_1$ and $720_2$, semiconductor layers underlying the gate stacks and including semiconductor material (e.g., silicon) of the additional semiconductor layers 313 surrounded by spacer material of inner spacers 1120, etch stop layers 620 underlying the semiconductor layer (the inner spacers 1120 are formed of different material than the etch stop layers 620), first and second pillars of backside trench S/D epitaxy $1110_1$, $1110_2$ and the self-aligned backside contact 1220. The first and second pillars of backside trench S/D epitaxy $1110_1$, $1110_2$ respectively contact the first and second pillars of S/D epitaxy $720_1$ and $720_2$ and are insulated from the semiconductor material of the additional semiconductor layers 313 by the inner spacers 1120. The self-aligned backside contact 1220 contacts the first pillar of the backside trench S/D epitaxy $1110_1$ and is insulated from the semiconductor material of the additional semiconductor layers 313 by the etch stop layer 620. The BSPDN 1230 is disposed in contact with the self-aligned backside contact 1220. The contact 830 (hereinafter referred to as a "frontside contact 830") is disposed in contact with the second pillar of S/D epitaxy $720_2$, the BEOL layer 840 is disposed in contact with the frontside contact 830 and the carrier wafer 850 overlies the BEOL layer 840.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having." "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower." "right," "left." "vertical," "horizontal," "top." "bottom," and derivatives thereof shall relate to the described structures and methods, as oriented in the drawing figures. The terms "overlying." "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below." "lower." "above." "upper." and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element." means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device, comprising:
   source/drain (S/D) epitaxy;
   a gate stack adjacent to the S/D epitaxy;
   a semiconductor layer underlying the gate stack and comprising a semiconductor material surrounded by an inner spacer;
   an etch stop layer underlying the semiconductor layer and comprising a lowermost etch stop layer surface;
   backside trench S/D epitaxy contacting the S/D epitaxy, comprising a lowermost backside trench S/D epitaxy surface, which is coplanar with the lowermost etch stop layer surface, and being insulated from the semiconductor material by the inner spacer; and
   a self-aligned backside contact contacting the backside trench S/D epitaxy and being insulated from the semiconductor material by the etch stop layer.

2. The semiconductor device according to claim 1, wherein the S/D epitaxy is doped.

3. The semiconductor device according to claim 1, wherein the gate stack comprises a nanosheet gate stack.

4. The semiconductor device according to claim 1, wherein the semiconductor layer comprises silicon.

5. The semiconductor device according to claim 1, wherein the inner spacer is a different material from the etch stop layer.

6. The semiconductor device according to claim 1, wherein:
   the S/D epitaxy comprises first and second S/D epitaxy,
   the backside trench S/D epitaxy comprises first and second backside trench S/D epitaxy respectively contacting the first and second S/D epitaxy, and
   the self-aligned backside contact is disposed in contact with the first backside trench S/D epitaxy.

7. The semiconductor device according to claim 6, further comprising a backside power distribution network (BSPDN) disposed in contact with the self-aligned backside contact.

8. The semiconductor device according to claim 6, further comprising:
   a frontside contact disposed in contact with the second S/D epitaxy;
   a back-end-of-line (BEOL) layer disposed in contact with the frontside contact; and
   a carrier wafer overlying the BEOL layer.

9. A semiconductor device, comprising:
   first and second pillars of source/drain (S/D) epitaxy;
   gate stacks adjacent to each of the first and second pillars of the S/D epitaxy;
   a semiconductor layer underlying each of the gate stacks and comprising a semiconductor material surrounded by an inner spacer;
   an etch stop layer underlying each semiconductor layer and comprising a lowermost etch stop layer surface;
   first and second pillars of backside trench S/D epitaxy respectively contacting the first and second pillars of the S/D epitaxy, comprising a lowermost backside trench S/D epitaxy surface, which is coplanar with the lowermost etch stop layer surface, and being insulated from the corresponding semiconductor material by the corresponding inner spacer; and
   a self-aligned backside contact contacting the first pillar of the backside trench S/D epitaxy and being insulated from the corresponding semiconductor material by the corresponding etch stop layer.

10. The semiconductor device according to claim 9, wherein the first and second pillars of source/drain (S/D) epitaxy are doped and the gate stacks comprise nanosheet gate stacks.

11. The semiconductor device according to claim 9, further comprising a backside power distribution network (BSPDN) disposed in contact with the self-aligned backside contact.

12. The semiconductor device according to claim 9, further comprising:
   a frontside contact disposed in contact with the second pillar of the S/D epitaxy;
   a back-end-of-line (BEOL) layer disposed in contact with the frontside contact; and
   a carrier wafer overlying the BEOL layer.

13. A method of semiconductor device fabrication, comprising:
   forming additional and sacrificial semiconductor layers underlying a gate stack;
   replacing the sacrificial semiconductor layer with an etch stop layer comprising a lowermost etch stop layer surface;
   removing a semiconductor substrate underlying the etch stop layer;
   indenting a semiconductor material of the additional semiconductor layer to form an indentation;
   disposing an inner spacer in the indentation;
   forming backside trench source/drain (S/D) epitaxy contacting S/D epitaxy to which the gate stack is adjacent, comprising a lowermost backside trench S/D epitaxy surface, which is coplanar with the lowermost etch stop layer surface, and being insulated from the semiconductor material by the inner spacer; and
   forming a self-aligned backside contact contacting the backside trench S/D epitaxy and being insulated from the semiconductor material by the etch stop layer.

14. The method according to claim 13, further comprising doping the S/D epitaxy.

15. The method according to claim 13, wherein the gate stack comprises a nanosheet gate stack.

16. The method according to claim 13, wherein the semiconductor layer comprises silicon.

17. The method according to claim 13, wherein the inner spacer is a different material from the etch stop layer.

18. The method according to claim 13, wherein:
   the S/D epitaxy comprises first and second S/D epitaxy,
   the forming of the backside trench S/D epitaxy comprises forming the backside trench S/D epitaxy to comprise first and second backside trench S/D epitaxy respectively contacting the first and second S/D epitaxy, and
   the forming of the self-aligned backside contact comprises forming the self-aligned backside contact to be disposed in contact with the first backside trench S/D epitaxy.

19. The method according to claim 18, further comprising disposing a backside power distribution network (BSPDN) in contact with the self-aligned backside contact.

20. The method according to claim 18, further comprising:
   disposing a frontside contact in contact with the second S/D epitaxy;
   disposing a back-end-of-line (BEOL) layer in contact with the frontside contact; and
   overlaying a carrier wafer over the BEOL layer.

* * * * *